United States Patent
Aggarwal

(10) Patent No.: US 6,592,318 B2
(45) Date of Patent: Jul. 15, 2003

(54) DOCKING CART WITH INTEGRATED LOAD PORT

(75) Inventor: Ravinder K. Aggarwal, Gilbert, AZ (US)

(73) Assignee: ASM America, Inc., Phoenix, AZ (US)

( * ) Notice: Subject to any disclaimer, the term of this patent is extended or adjusted under 35 U.S.C. 154(b) by 0 days.

(21) Appl. No.: 09/905,578

(22) Filed: Jul. 13, 2001

(65) Prior Publication Data

US 2003/0012626 A1 Jan. 16, 2003

(51) Int. Cl.$^7$ ................................................ B65G 49/07
(52) U.S. Cl. .................... 414/217.1; 414/805; 414/939; 414/940
(58) Field of Search ................................ 414/940, 217, 414/217.1, 939, 941, 495, 589, 805; 118/500, 719; 269/17

(56) References Cited

U.S. PATENT DOCUMENTS

| | | | |
|---|---|---|---|
| 4,851,018 A | * | 7/1989 | Lazzari et al. ................. 55/356 |
| 5,139,459 A | * | 8/1992 | Takahashi et al. ........... 454/187 |
| 5,364,219 A | * | 11/1994 | Takahashi et al. ........... 414/217 |
| 5,431,600 A | * | 7/1995 | Murata et al. ........... 414/940 X |
| 5,570,987 A | | 11/1996 | McKenna |
| 5,570,990 A | * | 11/1996 | Bonora et al. ........ 414/217.1 X |
| 5,607,276 A | | 3/1997 | Muka et al. |
| 5,628,604 A | | 5/1997 | Murata et al. |
| 5,655,869 A | * | 8/1997 | Scheler et al. ......... 414/222.01 |
| 5,713,711 A | | 2/1998 | McKenna et al. |
| 5,772,386 A | | 6/1998 | Mages et al. |
| 5,885,045 A | | 3/1999 | Rush |
| 5,944,475 A | | 8/1999 | Bonora et al. |
| 5,957,648 A | | 9/1999 | Bachrach |
| 5,975,825 A | * | 11/1999 | Blattner et al. .............. 414/217 |
| 5,984,610 A | | 11/1999 | Rush et al. |
| 6,019,563 A | | 2/2000 | Murata et al. |
| 6,042,324 A | | 3/2000 | Aggarwal et al. |
| 6,079,927 A | | 6/2000 | Muka |
| 6,086,323 A | | 7/2000 | Rush et al. |
| 6,102,647 A | * | 8/2000 | Yap ........................ 414/940 X |
| 6,205,881 B1 | * | 3/2001 | Gravell et al. .......... 414/940 X |
| 6,364,593 B1 | * | 4/2002 | Hofmeister et al. .... 414/940 X |
| 6,364,922 B1 | * | 4/2002 | Tanaka et al. .......... 414/940 X |
| 6,443,686 B1 | * | 9/2002 | Wiesler et al. ............... 414/590 |
| 6,454,512 B1 | * | 9/2002 | Weiss ......................... 414/663 |
| 6,524,057 B1 | * | 2/2003 | Park ........................... 414/663 |

OTHER PUBLICATIONS

SEMI, Subordinate Documents: SEMI E47.1–0301, *Provisional Mechanical Specification for Boxes and Pods Used to Transport and Store 300mm Wafers*.
Semiconductor International, Jan. 1998, pp. 81–85 *PC–Based Control Technology and Semiconductor Fab Manufacturing*.

* cited by examiner

*Primary Examiner*—James W. Keenan
(74) *Attorney, Agent, or Firm*—Knobbe, Martens, Olson & Bear, LLP

(57) ABSTRACT

An integrated wafer transport and transfer device is disclosed, which includes a vehicle with an integrated docking platform for holding a wafer carrier such as a FOUP (front opening unified pod). The docking platform is positioned at the correct height for sealing the FOUP to the load lock of a process tool. Vertical and/or horizontal movement is required in some cases. Methods for delivering wafers to process tools are also described. In a preferred embodiment, wafers are carried inside a FOUP on a cart, such as an automatically guided vehicle or a personally guided vehicle. The cart is docked at a process tool and the FOUP is sealed to the load lock of the tool without removing the FOUP from the cart. After processing on one tool, the cart along with the FOUP can be moved to the next process tool for further processing. The FOUP can stay on the same cart until all processing is completed. This is especially useful for moving priority lots through the fabrication facility quickly.

17 Claims, 5 Drawing Sheets

DOCKING CART WITH INTEGRATED LOAD PORT

BACKGROUND OF THE INVENTION

1. Field of the Invention

This invention relates to placement of wafer cassettes at the loading port of a process tool, and, in particular, to transfer of wafer cassettes to a loading port without lifting the cassettes from the vehicle.

2. Description of the Related Art

Semiconductor wafers or other such substrates are typically subjected to many processing steps that involve moving a cassette of wafers from one type of apparatus to another. For example, wafers that have been subjected to a process such as chemical vapor deposition may have to be moved to another apparatus to be cleaned and dried and then transferred to yet another apparatus for additional processing steps. It is very important that the wafers in process be kept isolated from contamination both during transfer between the process tool and the wafer cassette and during transport from tool to tool.

One wafer isolation technique involves transferring the wafers in a sealed cassette or FOUP (front-opening unified pod) and carrying the FOUP on a personally guided vehicle (PGV) or an automatically guided vehicle (AGV). At each location, it is necessary to open the sealed pod to remove the wafers and position them for processing. Preferably the FOUP has a front-opening door that can be opened by robotic equipment after the door frame has been sealed against the process equipment. Opening the FOUP robotically minimizes contamination and minimizes labor requirements.

Presently, when a PGV carrying a FOUP arrives at the front end of a process tool, a lifting device raises the FOUP and places it at the loading port of the process tool. The lifting device may be operated manually or automatically. This operation is cumbersome and slow and, in manual mode, requires substantial maneuvering on the part of the operator to align the FOUP precisely onto the loading port of the tool. Accidents sometimes occur wherein the FOUP is dropped during this lifting step.

The cost of processing semiconductor wafers, always a prime consideration, is often evaluated by the throughput per unit of cost. Another measure of cost is the throughput per area of floor space, wherein it is desirable to reduce the footprint of the apparatus employed. Related to both is the importance of reducing the capital cost of equipment. Advancements that can improve the competitive edge by either measure are highly desirable.

SUMMARY OF THE INVENTION

Preferred embodiments of the current invention describe an integrated wafer transport and transfer device, comprising a vehicle with an integrated docking platform, a wafer carrier on the docking platform, an elevator for the integrated docking platform to set the wafer carrier at a position suitable for loading wafers into a process tool, a latching mechanism to hold the vehicle in place and a horizontal movement control to adjust the position of the integrated docking platform on the vehicle. Preferably the wafer carrier is a FOUP (front opening unified pod), and the vehicle is a personally guided vehicle (PGV) or an automatically guided vehicle (AGV).

Either the docking platform holds the FOUP at the correct height or an elevator on the vehicle sets the docking platform at the correct height for sealing against a front face of a process tool. An automatic or a manual device can transfer the FOUP to seal against the process tool by moving the docking platform horizontally.

A method for processing wafers in a fabrication facility is described, which comprises storing the wafers in a wafer carrier or FOUP, carrying the wafer carrier on a vehicle wherein the wafer carrier is held on a docking platform at the height of the load port of a process tool, latching the vehicle to the process tool and moving the docking platform horizontally to seal the wafer carrier against a front face of the load port using a horizontal movement control integrated into the vehicle. One embodiment describes keeping a particular FOUP and a particular vehicle together as they move from one process tool to another.

A method of transferring wafers to a process tool is described that comprises carrying the wafers inside a FOUP on a cart, docking the cart at the process tool, sealing the FOUP to a load lock of the process tool without removing the FOUP from the cart and using a robot to transfer wafers between the FOUP and the process tool while the FOUP is still on the cart.

DETAILED DESCRIPTION OF THE PREFERRED EMBODIMENT

The embodiments described herein can be used to move wafers to processing stations throughout the fabrication facility quickly and safely. The main features of the embodiments include keeping the FOUP or other wafer carrier with a cart, such as a personally guided vehicle (PGV) or an automatically guided vehicle (AGV), throughout a processing sequence. The FOUP does not leave the cart, but rather stays on a docking platform on the cart. Movement control mechanisms on the cart position the docking platform to put the FOUP in place for sealing against the loading port of each process tool. For priority wafer lots, the path of an AGV can be programmed so that the AGV and the FOUP can be moved very quickly from one process tool to another in a desired sequence. These and other advantages are described in the embodiments below.

Figure 1A:
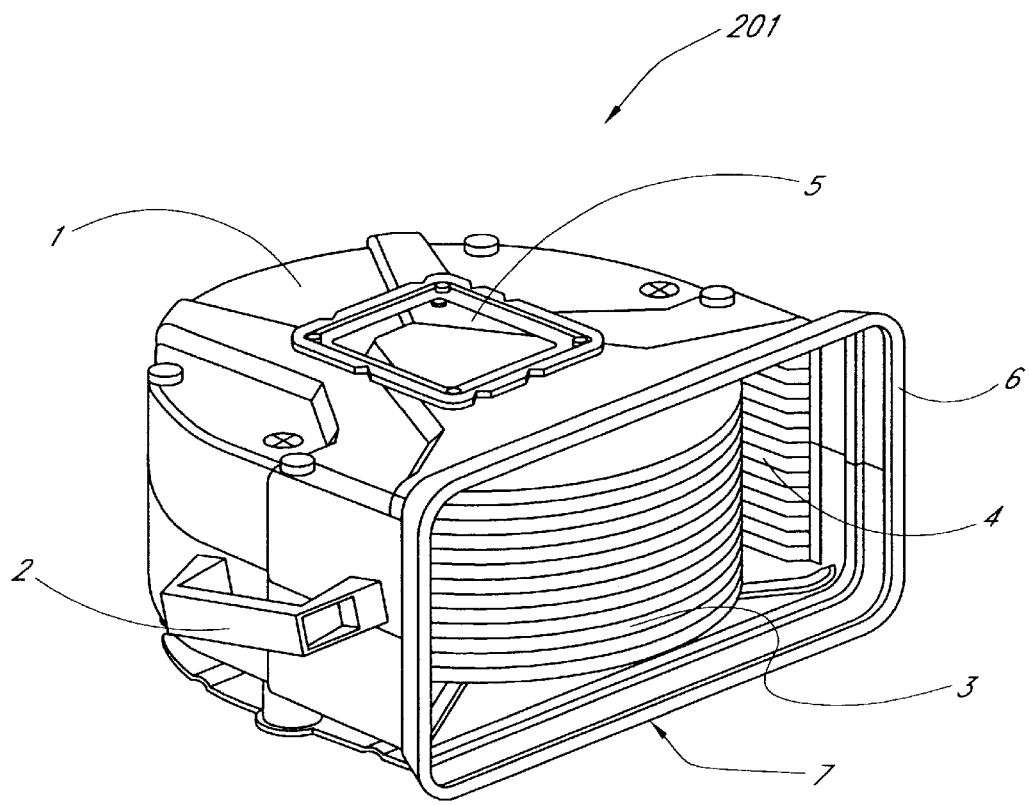
FIG. 1A is a top, front and left perspective view of a FOUP from the prior art.

During transport and storage in a fabrication facility, wafers are contained inside a front-opening unified pod (FOUP) carrier 201, shown in FIG. 1A with the door removed. The FOUP 201 includes spaced shelves for holding wafers, similar to a standard open wafer cassette, as well as a door (not shown) for sealing the FOUP during transport. The FOUP has a standard mechanical interface (SMIF) for attaching to process tools. The FOUP isolates the wafers from ambient particulate and molecular contamination, while also providing accurate wafer positioning. The Semiconductor Equipment Materials International Standards Program (document SEMI E47.1) describes specifications for boxes and pods used to transport and store 300-mm wafers and is hereby incorporated herein by reference.

Figure 1B:
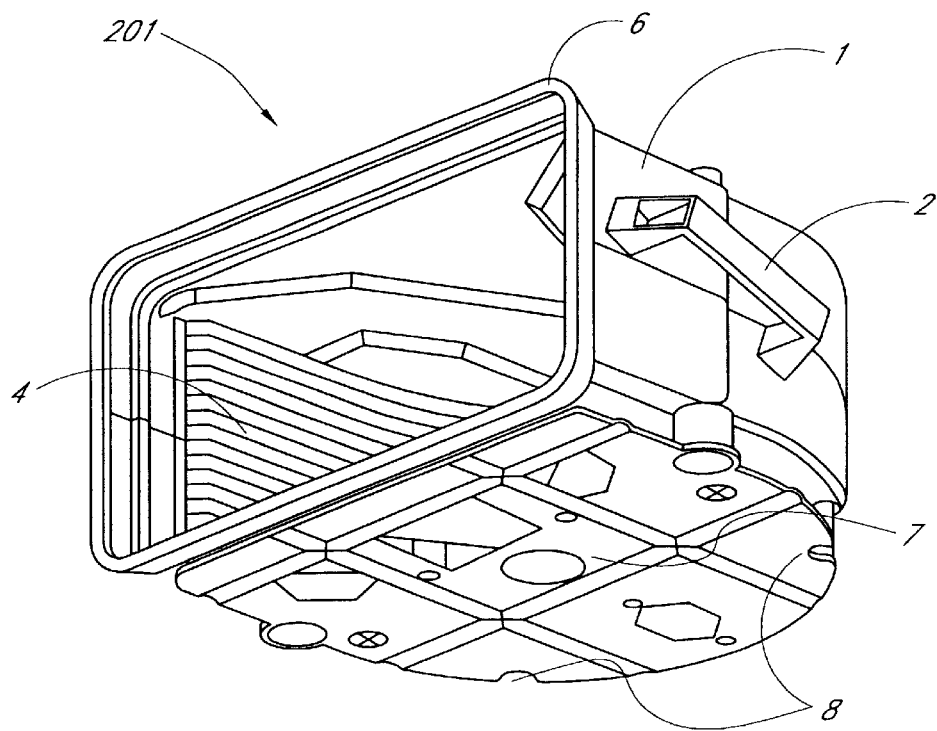
FIG. 1B is a bottom, front and right perspective view of the FOUP of FIG. 1A.

With reference to FIGS. 1A and 1B, the box shell 1 of the FOUP 201 (described in SEMI E47.1-0997) is fitted with a handle 2 for transporting the FOUP manually. Inside, the wafers 3 are held spaced apart in a stack and supported by slots 4. The top of the FOUP has a handling flange 5 that can be engaged by a robot (not shown) to move the FOUP. There is a sealing mechanism 6 at the front opening of the FOUP that is designed to press against and seal to a surface of a loading port at a process tool. On the bottom side of the FOUP, there is a coupling plate 7 (described in SEMI E47.1-0997) that contains recess pockets 8 to facilitate in transport and self-locating placement of the FOUP. The door that closes the FOUP during transport is not shown.

Figure 2:
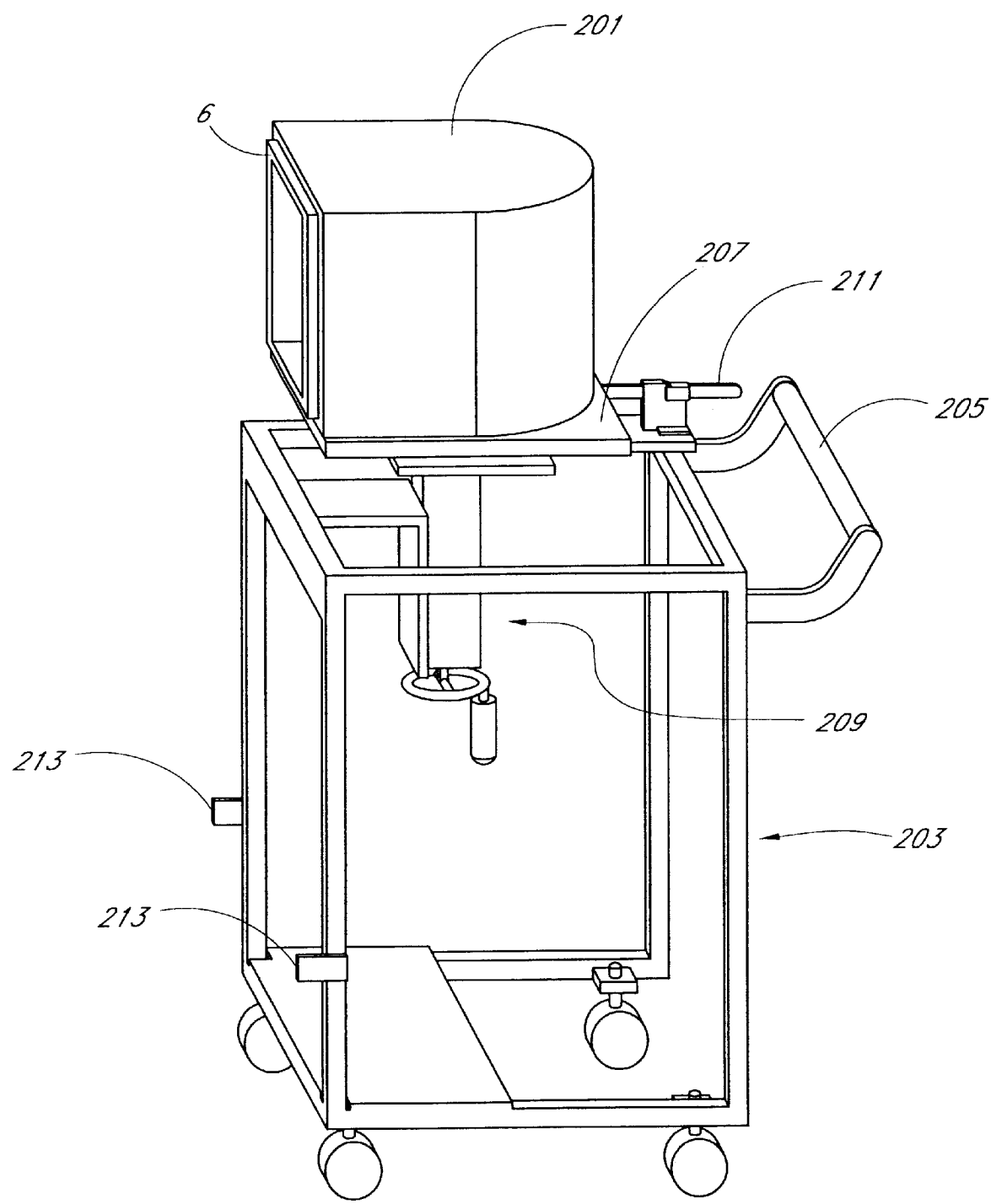
FIG. 2 is a perspective view of a FOUP on a transport cart according to an illustrated embodiment of the current invention.

FIG. 2 shows schematically the arrangement of a FOUP 201 on a personally guided vehicle (PGV) 203 according to an illustrated embodiment of the current invention. Alternatively, the FOUP 201 can be carried on an automatically guided vehicle (AGV). The PGV 203 is moved through the fabrication facility manually by an operator using the PGV handle 205. The FOUP 201 rests on a docking platform 207. The position of the docking platform 207 is controlled in the vertical direction by an elevator 209 and in the horizontal direction by a horizontal movement control 211 that is either a geared or a pneumatic mechanism. In the illustrated embodiment, both the elevator 209 and the horizontal movement control 211 are operated manually. In other arrangements these vertical controls 209 and/or horizontal 211 controls may be operated automatically. There are latching mechanisms 213 to attach the PGV 203 to the process tool to hold it in a fixed position during FOUP positioning, wafer transfer and wafer processing.

Figure 3:
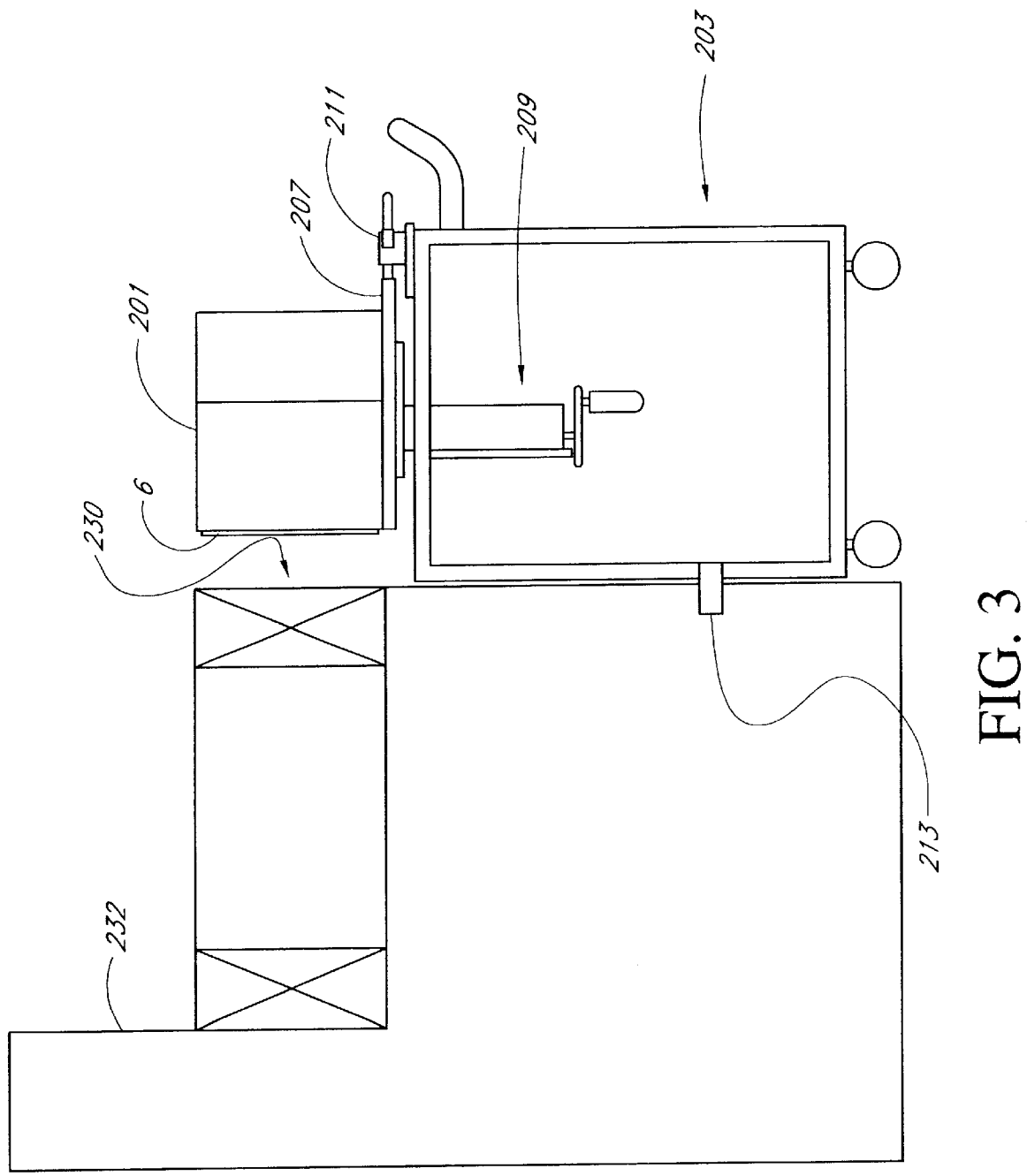
FIG. 3 is cross-sectional view of a cart with an integrated docking platform, a FOUP and a process tool according to a preferred embodiment of the present invention.

FIG. 3 shows the arrangement of a transport cart, such as an AGV or a PGV 203, and a FOUP 201 near the loading port 230 of a process tool 232 according to an illustrated embodiment of the current invention. In other arrangements the cart can be larger and include multiple FOUPs whose positions can be exchanged on the cart. A transfer robot or robots can selectively place each FOUP on the integrated docking platform 207. In one arrangement, the loading port 230 is part of a front end interface available from Asyst Technologies, Inc. of Fremont, Calif. under the product name Plus Portal. A latching mechanism 213 is shown attaching the PGV 203 to the process tool, thus ensuring that the PGV stays in place during wafer transfer and processing. The docking platform 207 is positioned in the vertical direction so that it is level with the entrance of the load port of the process tool. The heights of the docking platform 207 and the loading port 230 can be matched through use of the illustrated elevator 209, but in other arrangements, the heights are matched by design, and no elevator is needed. The PGV 203 has been moved up against process tool 232 and the latching mechanism 213 between the PGV 203 and the process tool 232 has been engaged. If necessary, the horizontal movement control 211 is used to move the FOUP 201 horizontally until the sealing mechanism 6 seals against the loading port 230. Alternatively, the FOUP 201 seals against the loading port 230 when the vehicle 203 is latched to the process tool 232, and no separate movement of the docking platform 207 is necessary. The door of the FOUP 201 opens, and the wafer robot (not shown) of the processing tool 232 removes individual wafers for processing.

Figure 4:
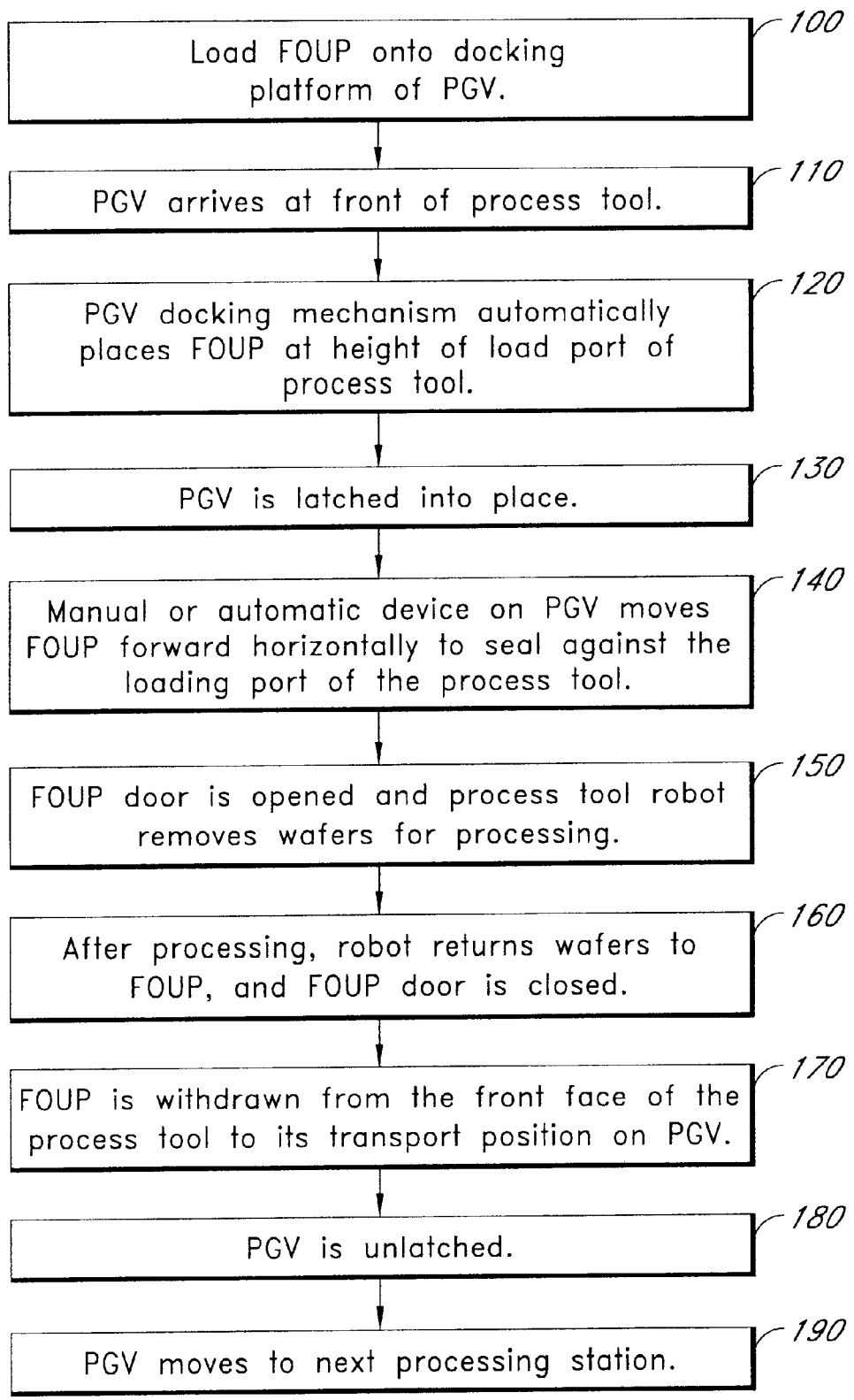
FIG. 4 is a flow chart describing the procedure for transferring wafers to and from a process tool according to a preferred embodiment of the present invention.

A method of transferring wafers to a processing tool according to a preferred embodiment of the current invention is described in the flow chart of FIG. 4. The FOUP is loaded 100 onto the docking platform of a PGV. This initial loading 100 can be done manually by an operator, but is preferably done by a robot. An operator in the fabrication facility moves 110 the PGV to the first process tool. The docking platform automatically places 120 the FOUP at the height of the load port of the process tool. Next the PGV is latched 130 into place to prevent any relative movement between the cart and the process tool as wafers are loaded for processing. A horizontal movement control engaged by the operator or an automatic device on the PGV moves 140 the FOUP forward horizontally to seal against the loading port of the process tool. In some arrangements there is no need to move the FOUP forward separately, as it seals directly against the tool from its position on the docking platform of the PGV when the PGV is moved into place. In step 150, the FOUP door is opened and the wafer robot of the processing tool removes wafers for processing. After the wafers are processed, the robot returns them to their slots in the FOUP. When all wafers have been processed and returned, the FOUP door is closed 160. The FOUP is withdrawn 170 from the loading port and moves back to its transport position on the PGV. In the arrangement discussed above, wherein no FOUP movement is necessary to seal it against the tool, the FOUP is already in transport position on the PGV after processing, and moving back is not needed. The PGV is unlatched 180 from the process tool, and it moves on 190 to the next processing station, where the procedure starts over again with step 110. During this entire sequence the FOUP is not moved relative to the docking platform. It is the docking platform that moves relative to the vehicle to place the FOUP in position for processing and for transport.

A particular FOUP and a particular vehicle can stay together as they move through the fabrication facility. An AGV can be programmed to follow a specific path from one process tool to another until the entire wafer processing sequence is completed. Thus, the chances of processing the wafers incorrectly is reduced. This is especially useful for urgent wafer lots in which the FOUP has to be moved quickly, in a desired sequence, from one tool to another on a priority basis.

Figure 5:
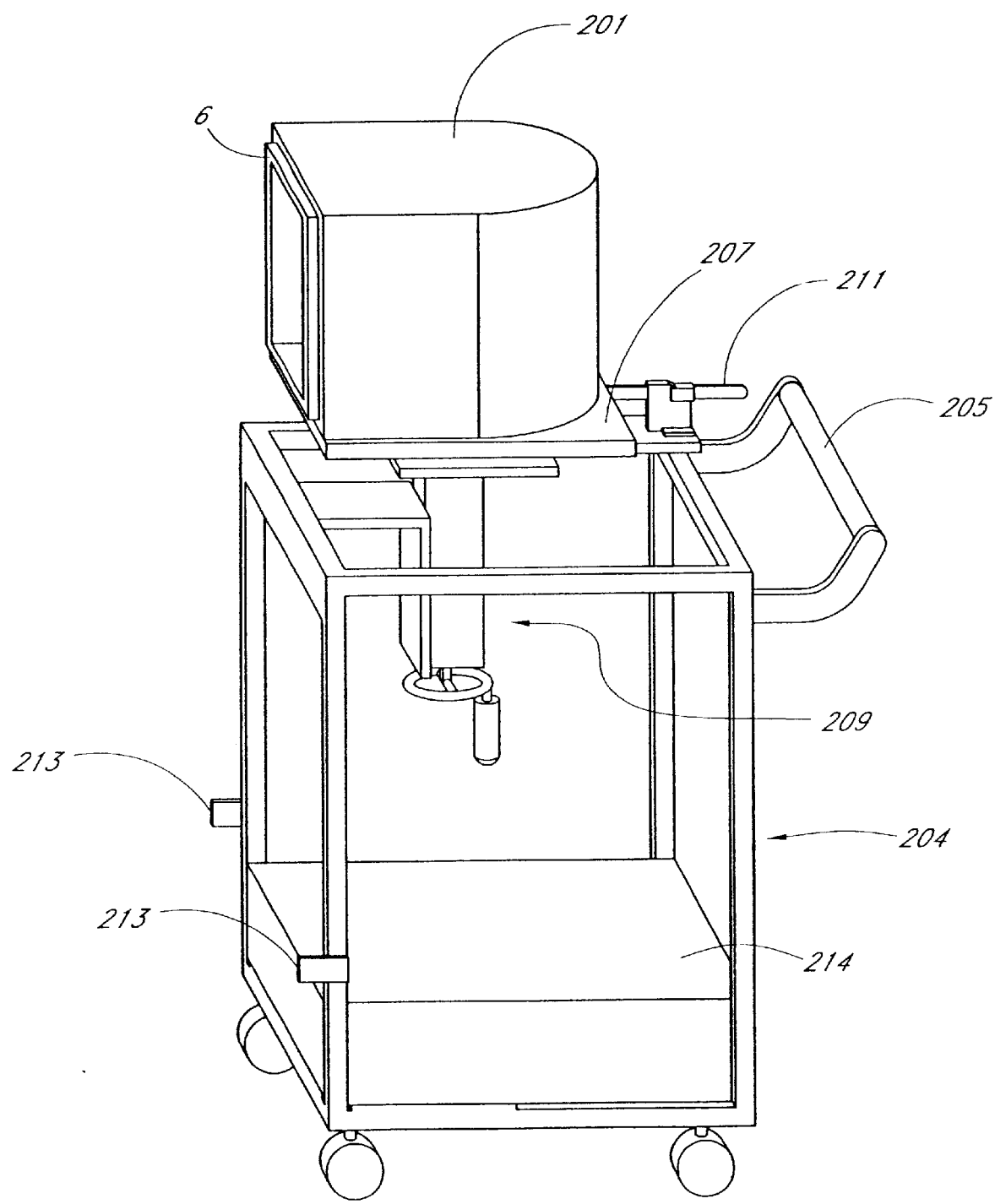
FIG. 5 is an alternate arrangement of the cart of FIGS. 2–4, the illustrated cart being an automatically guided vehicle (AGV) including a motor means.

With reference to FIG. 5, an alternate arrangement of the personally guided vehicle (PGV) 203 of FIGS. 2–4 is shown. In the shown alternate embodiment, the illustrated cart, rather than being a PGV, is an automatically guided vehicle (AGV) 204 including a motor means 214 for moving the vehicle 204.

An exemplary sequence for processing a priority lot of wafers begins with loading the wafers into a FOUP and placing the FOUP onto the loading platform of a cart. The cart is moved, either manually or automatically, to the first process tool and is latched to the tool to prevent any relative motion between the vehicle and the tool. The positioning mechanisms, both the vertical elevator and the horizontal movement control, adjust the position of the docking platform to seal the FOUP against the loading port of the process tool. A first wafer is moved into the process chamber by a robot associated with the process tool, and wafer processing is performed. The robot returns the first wafer to the FOUP. Subsequent wafers are removed, processed and returned until all wafers in the cassette have been processed. The docking platform is retracted to a transport position on the cart. The cart is unlatched from the first process tool and moves on to the second process tool. The steps performed at the first process tool are repeated at the second process tool. The cart moves, either manually or automatically, on to subsequent process tools, repeating the steps performed at the first process tool, thus allowing the wafers to undergo further processing until the sequence is complete.

Keeping the FOUP and the cart together as they move from one process tool to another is especially useful for priority wafers where the FOUP must be moved quickly for processing. This method makes it easy to move and to track the FOUPs as they progress through the fabrication facility.

In the illustrated embodiment, the FOUP is never lifted off the PGV/AGV except when it is loaded at the beginning or unloaded at the end of a processing sequence. This eliminates many cumbersome operations and reduces substantially the chances of dropping a FOUP. If a FOUP is dropped, all the wafers within it are lost due to either breakage or contamination. This represents a significant loss of product.

Aligning the FOUP is simple in the preferred embodiments. Once the docking platform is in place, FOUP alignment to the loading port of the process tool is complete. In the prior art it was a painstaking process to make precise alignment between the FOUP and the loading port when the FOUP was lifted manually and moved over to the tool.

Hence, although the foregoing description of the preferred embodiment of the present invention has shown, described and pointed out the fundamental novel features of the invention, it will be understood that various omissions, substitutions and changes in the form of the detail of the apparatus as illustrated as well as the uses thereof may be made by those skilled in the art, without departing from the spirit of the present invention. Consequently, the scope of the present invention should not be limited to the foregoing discussion, but should be defined by the appended claims.

I claim:

1. An integrated wafer transport and transfer device comprising:
   a vehicle with an integrated docking platform;
   a wafer carrier positioned on the docking platform;
   an elevator for the integrated docking platform to set the wafer carrier at a position suitable for loading wafers into a process tool;
   a horizontal movement control to adjust the position of the integrated docking platform on the vehicle; and
   a latching mechanism to hold the vehicle in place at the process tool.

2. The device of claim 1 wherein the wafer carrier is a FOUP (front opening unified pod).

3. The device of claim 1 wherein the vehicle is a personally guided vehicle (PGV).

4. The device of claim 1 wherein the vehicle is an automatically guided vehicle (AGV).

5. An integrated transport and docking device for a wafer FOUP (front opening unified pod) comprising:
   a transport cart;
   a docking platform on the transport cart wherein the docking platform holds the FOUP at a height where it can seal against a front face of a process tool;
   a latch to hold the transport cart in place at the process tool; and
   an automatic device to adjust the position of the docking platform horizontally to seal the FOUP against the front face of the process tool.

6. The device of claim 5, further comprising on the vehicle an elevator that sets the docking platform at a height where the FOUP can seal against the front face of the process tool.

7. A method for processing wafers in a fabrication facility, comprising:
   storing the wafers in a wafer carrier;
   carrying the wafer carrier on a vehicle wherein the wafer carrier is held on a docking platform at a height of a load port of a process tool;
   latching the vehicle to the process tool; and
   moving the docking platform exclusively horizontally to seal the wafer carrier against a front face of the load port of the process tool using a horizontal movement control integrated into the vehicle.

8. The method of claim 7 wherein the wafer carrier is a FOUP.

9. The method of claim 7 wherein the horizontal movement control operates manually.

10. The method of claim 7 wherein the horizontal movement control operates automatically.

11. The method of claim 7, further comprising using a robot to transfer wafers between the FOUP and the process tool.

12. The method of claim 11 further comprising, after processing is complete, using the horizontal movement control to move the docking platform away from the process tool onto a transport position on the vehicle.

13. The method of claim 7, further comprising keeping a particular FOUP and a particular vehicle together as they move from one process tool to another.

14. The method of claim 7 wherein the vehicle is a personally guided vehicle (PGV).

15. The method of claim 7 wherein the vehicle is an automatically guided vehicle (AGV).

16. The method of claim 15 wherein the AGV is programmed to take the wafer carrier along a specific path from one process tool to another until an entire wafer processing sequence is completed.

17. A method of transferring wafers to a process tool comprising:
   carrying the wafers inside a front opening unified pod (FOUP) on a cart;
   docking the cart at the process tool;
   sealing the FOUP to a load lock of the process tool without removing the FOUP from the cart; and
   using a process tool robot to transfer wafers between the FOUP and the process tool while the FOUP is still on the cart.

* * * * *